United States Patent [19]
Wendt et al.

[11] Patent Number: 6,023,636
[45] Date of Patent: Feb. 8, 2000

[54] MAGNETIC RESONANCE APPARATUS AND METHOD FOR DETERMINING THE LOCATION OF A POSITIONABLE OBJECT IN A SUBJECT

[75] Inventors: Michael Wendt, Cleveland, Ohio; Martin Busch, Witten, Germany; Axel Bornstedt, Berlin, Germany; Rainer Seibel, Essen, Germany; Dietrich Groenemeyer, Sprokhoevel, Germany

[73] Assignee: Siemens Aktiengesellschaft, Munich, Germany

[21] Appl. No.: 09/098,427

[22] Filed: Jun. 17, 1998

[30] Foreign Application Priority Data

Jun. 25, 1997 [DE] Germany .......................... 197 27 081

[51] Int. Cl.[7] ................................................. A61B 5/055
[52] U.S. Cl. ...................... 600/410; 600/423; 600/424; 324/309; 324/318
[58] Field of Search ..................................... 600/410, 422, 600/423, 424; 324/307, 309, 318, 322

[56] References Cited

U.S. PATENT DOCUMENTS

| | | | |
|---|---|---|---|
| 5,318,025 | 6/1994 | Dumoulin et al. | 600/424 |
| 5,353,795 | 10/1994 | Souza et al. | 600/423 |
| 5,644,234 | 7/1997 | Rasche et al. | |
| 5,687,725 | 11/1997 | Wendt . | |
| 5,754,046 | 5/1998 | Busch et al. | |
| 5,810,728 | 9/1998 | Kuhn | 600/410 |
| 5,868,674 | 2/1999 | Glowinski et al. | 600/424 |

*Primary Examiner*—Ruth S. Smith
*Attorney, Agent, or Firm*—Hill & Simpson

[57] ABSTRACT

In a method for the location determination of a positionable object in an examination subject by means of magnetic resonance and apparatus for the implementation of the method a reference image is acquired from at least one slice of the examination subject. The current position of the subject is determined by at least one radio-frequency reception coil attached to the object. A slice position in which the reference image is updated is determined on the basis of this current position.

20 Claims, 5 Drawing Sheets

MAGNETIC RESONANCE APPARATUS AND METHOD FOR DETERMINING THE LOCATION OF A POSITIONABLE OBJECT IN A SUBJECT

BACKGROUND OF THE INVENTION

1. Field of the Invention

The present invention is directed to a method for determining the location of a positionable object in an examination subject by means of magnetic resonance, as well as to a magnetic resonance apparatus for implementing the method.

2. Description of the Prior Art

A comparatively good accessibility to the patient during the examination is established with a nuclear magnetic resonance tomography apparatus of the type marketed, for example, by Siemens AG under the name "Magnetom Open®". This apparatus allows working at the patient with interventional instruments during the MR imaging. Typical applications are, for example, surgery (particularly what is referred to as minimally invasive surgery) and biopsy, whereby the position of the instrument can be observed on a picture screen. Of course, chronologically and spatially exact information about the position of the instrument in the body are required for these procedures. Essentially two problems arise given such applications.

A real-time monitoring of the instrument position with the required spatial resolution and an adequately high signal-to-noise ratio makes extreme demands of the speed of the data acquisition and processing when entire datasets must be successively updated. There are various proposals for solving the speed problem. Thus, for example, German OS 43 17 028 discloses a method wherein, after the registration of an overall dataset, only a sub-region of the dataset that arose from the preceding measurement is updated using measured data of a following measurement. A central region of the k-space, which essentially defines the image impression, is thereby constantly updated; in addition, changing sub-regions of the overall dataset are updated. Measurement time is saved to a considerable extent because the entire dataset is not constantly updated, so that the chronological resolution of the method is correspondingly improved in view of the moving instrument.

German OS 195 28 436, corresponding to U.S. Pat. No. 5,687,725, discloses wavelet coding of the raw datasets, which have been frequency-coded in a conventional way in the direction of the motion path of an interventional instrument, with the wavelet coding being perpendicular to the motion path. Differing from conventional frequency coding with Fourier transformation, wavelet functions are spatially localized, i.e. wavelet functions are generated at different locations over the observation window. The region of the motion path thus can be designationally imaged.

A further problem is that instruments, probes, catheters, etc., which are introduced into the body to be examined, are not visible in the MR image without further measures. Protons are primarily employed for image generation. The instruments utilized in interventional applications, however, usually do not contain a concentration of protons adequate for the imaging, so that a direct visual supervision in the MR image is hardly possible. Given known arrangements, the location determination therefore ensues with the assistance of a radio-frequency coil attached to the interventional instrument that measures the nuclear magnetic excitation in its immediate environment. Typically, a dataset of the entire volume of interest of the examination subject is first registered and a reference image is acquired therefrom. An antenna that covers the entire examination region is connected to a radio-frequency reception unit. Subsequently, the radio-frequency reception unit is switched to the radio-frequency reception coil attached to the interventional object. The position of this radio-frequency reception coil, and thus of the interventional instrument, is determined by exciting the entire examination region and a gradient is subsequently activated in a first direction, so that the signal measured with the radio-frequency reception coil is unambiguously frequency-coded in this orientation. The frequency of the maximum amplitude is identified after a Fourier transformation of the registered data. The position of the radio-frequency reception coil in the direction of the first gradient can be unambiguously derived from this frequency. This sequence is then repeated with gradients in the two other spatial directions. The position of the reception coil in the examination region can be unambiguously determined after three such sequences.

The position of the radio-frequency reception coil acquired in this way can then be mixed into the previously acquired reference image dataset. To that end, the slice corresponding to this position is selected. The correct position is identified and marked within this slice.

Due to the limited pickup speed of the MR method given the currently available pulse sequences, the following problem occurs. It must be expected that the position of the patient will change over the time span of an interventional operation. The once-registered reference image dataset thus no longer coincides with the current conditions over the course of an examination. The reference dataset must be constantly updated in order to avoid having the position of the interventional instrument being incorrectly mixed into the reference image. Given conventional arrangements, this reference dataset must basically cover the entire volume in which the interventional instrument can be theoretically located. Since the reference dataset thus becomes extremely large, this procedure is very time-consuming, so that one rapidly encounters limits in the MR imaging with respect to the required chronological resolution in combination with an exact spatial resolution.

SUMMARY OF THE INVENTION

It is an object of the present invention to provide a method and an apparatus which avoid the necessity of employing such a large reference dataset.

This object is achieved in a method for location determination of a positionable object in an examination subject by means of magnetic resonance by multiple repetition of the following steps. A reference image is acquired from at least one slice of the examination subject. MR signals are acquired under the influence of magnetic field gradients using at least one RF reception coil with a small sensitivity region attached to the object, the current position of the object being determined from the frequency/phase spectrum of these signals. A slice position in which the reference image is updated is defined on the basis of the current position of the object.

Differing from known methods, the dataset for the entire examination volume is no longer updated for the acquisition of a reference image, rather only for a slice in which the object is currently located. This is fully adequate for the position determination and leads to a considerable reduction of the dataset to be acquired, so that this method sequences significantly faster.

The above object achieved in an apparatus for location determination of a positionable object in an examination subject having a gradient drive arrangement, an RF antenna for transmitting and receiving RF radiation, at least one RF reception coil arranged at the positionable object, an RF reception unit for MR signals, a position acquisition arrangement that determines the position of the object from the signals received from the RF reception coil, a signal processing circuit with which a reference image of at least one slice of the examination subject is produced from the signals received by the RF reception unit, and a control unit that drives the RF antenna in its transmission (emission) mode and the gradient drive such that a slice for updating a reference image is defined on the basis of the position of the object.

The apparatus achieves the same advantage described above in connection with the inventive method.

It should be noted that the invention can be applied not only to the initially explained, interventional operations, but also it can be utilized for any arbitrary position determination in a nuclear spin measurement (data acquisition).

DESCRIPTION OF THE PREFERRED EMBODIMENTS

Figure 1:
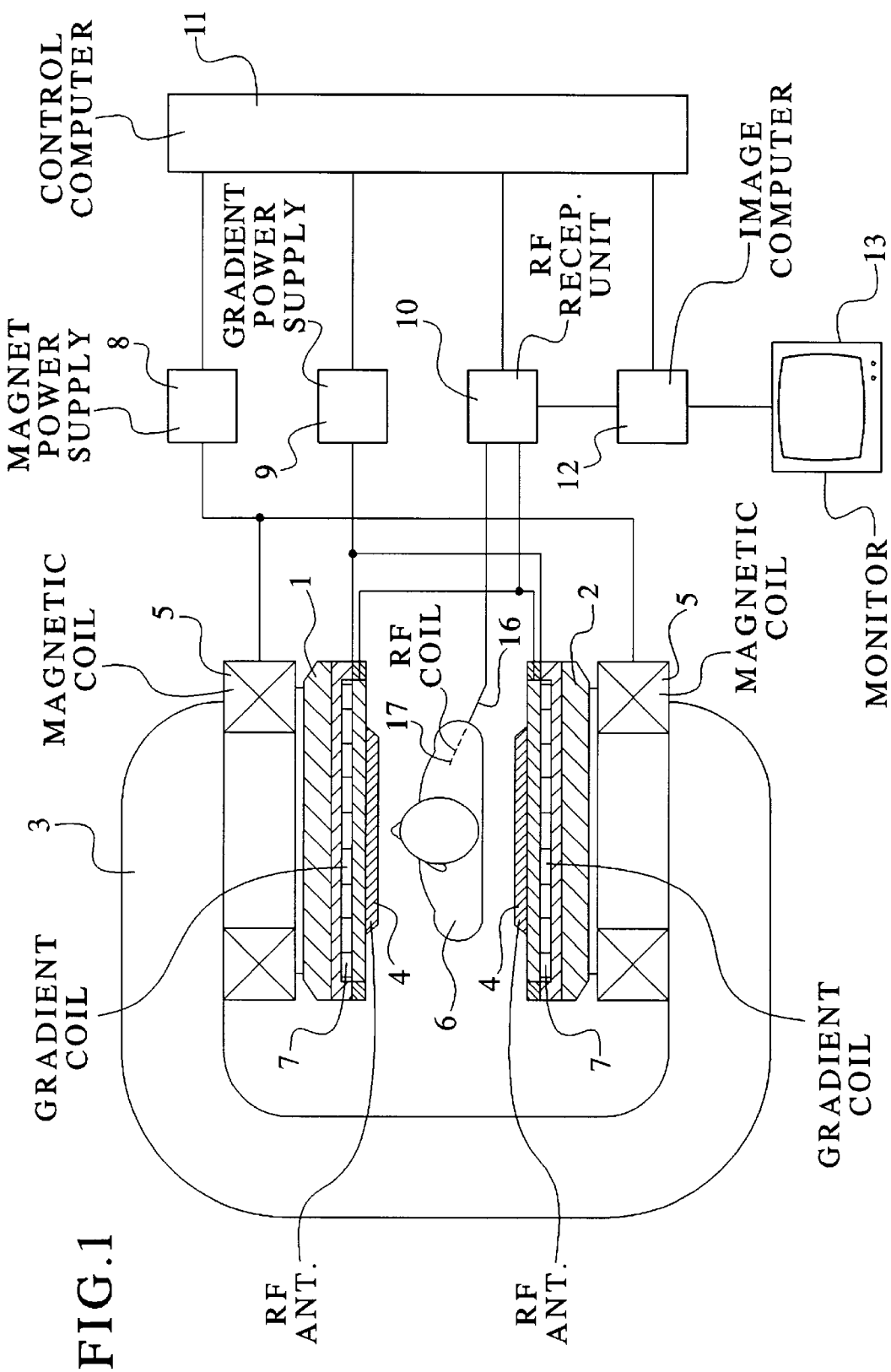
FIG. 1 is a schematic block diagram of a MR constructed and operating in accordance with the invention.

FIG. 1 schematically shows a known pole shoe magnet of a nuclear magnetic resonance tomography apparatus, having a pile shoe magnet with a C-shaped yoke as disclosed, for example, in U.S. Pat. No. 5,200,701. In the exemplary embodiment of FIG. 1, the basic magnetic field is produced by normally conductive magnet coils 5. Gradient coil sets 7 and radio-frequency antennas 4 (i.e., whole-body antennas) are respectively attached in the region of the pole shoes 1 and 2. In the exemplary embodiment, the radio-frequency antennas serve for transmission, i.e. for exciting nuclear magnetic resonance signals in the examination subject. Further, the nuclear magnetic resonance signals are also acquired for the data acquisition for the reference images.

The magnet coils 5 are supplied by a magnet power supply 8 and the gradient coil sets 7 are supplied by a gradient power supply 9.

The nuclear magnetic resonance signals arising after an excitation are then received in two ways: First, via the reception antennas 4, and a reference image is acquired from these signals. Second, nuclear magnetic resonance signals are received with a radio-frequency reception coil 17 that, for example, is introduced into the body of a patient 6 with a probe 16.

The radio-frequency coil 17 as well as the radio-frequency antennas 4 are connected to a radio-frequency reception unit 10 in a way that will be explained in greater detail below. A reference image of the examination region as well as a marking for the position of the radio-frequency reception coil 17 are produced by an image computer 12 from the signals acquired with the radio-frequency unit 10, the reference image and the marking being superimposed in an image on a monitor 13.

Figure 2:
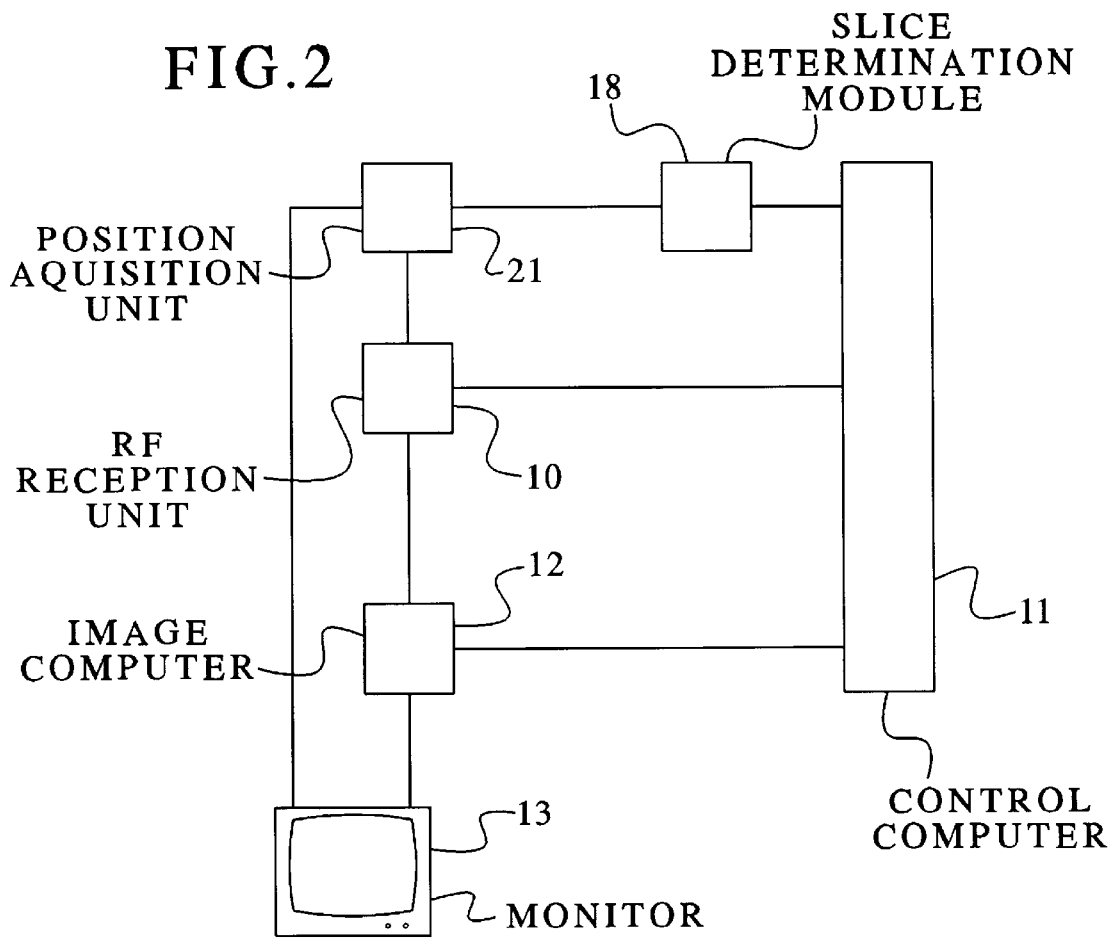
FIG. 2 is a schematic block diagram of a signal processing channel of the system of FIG. 1, with a position acquisition arrangement and a module for the slice determination in accordance with the invention.

In contrast to conventional systems, in the apparatus of FIG. 1 the current slice position is determined on the basis of the identified position of the radio-frequency reception coil, and the control computer 11 controls the entire measuring sequences such that data are acquired only for the current slice position. Compared to the conventional method of acquiring complete datasets from the entire examination volume, considerable measuring time thus can be saved. The time resolution of the method thus becomes correspondingly better. As schematically shown in FIG. 2, only a position acquisition unit 21 for the position of the radio-frequency coil 17 and a module 18 are required therefor, the latter determining a slice for data updating on the basis of the position of the radio-frequency reception coil calculated with the position acquisition unit 21 and forwarding it to the control computer 11. In practice, this module 18 can be implemented purely as software in, or as a software adjunct to, the control computer 11.

Figure 3:
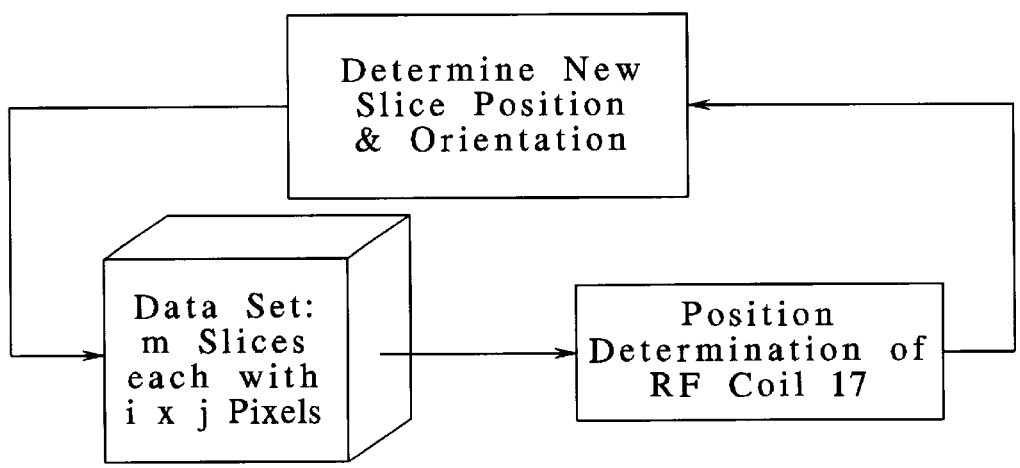
FIG. 3 schematically illustrates an example of a function execution in accordance with the invention.

The function execution is schematically shown in FIG. 3. First, a complete dataset with m slices each having i x j pixels is produced and utilized for the acquisition of a reference image. On the basis of a position determination of the radio-frequency reception coil 17, a slice position and orientation suitable for the exact identification of the position of the probe 16 are determined, and the dataset is henceforth updated only with respect to this slice. In order to avoid having the probe 16 disappear from the imaged region, one must merely adhere to the following relationship:

$$V_i \leq \frac{\frac{\text{number of layers}}{2} - 0.5 \cdot \text{layer thickness}}{\text{acquisition time}}$$

whereby $V_i$ is the feed rate of the radio-frequency reception coil perpendicular to the coil orientation. The maximum feed rate parallel to the individual slices is not critical compared to the rate perpendicular thereto. The slice position for which the dataset is to be updated will always be selected such that the tip of the probe lies in the updated slice. There are various possibilities with respect to the orientation of the updated slice. Defined, for example, by the user, the slice orientation can be automatically turned into the feed direction of the probe 16 (radio-frequency reception coil 17). Another example would be an orientation parallel to the motion vector and through a previously defined fixed point (for example, the target point for the probe 16).

Figure 4:
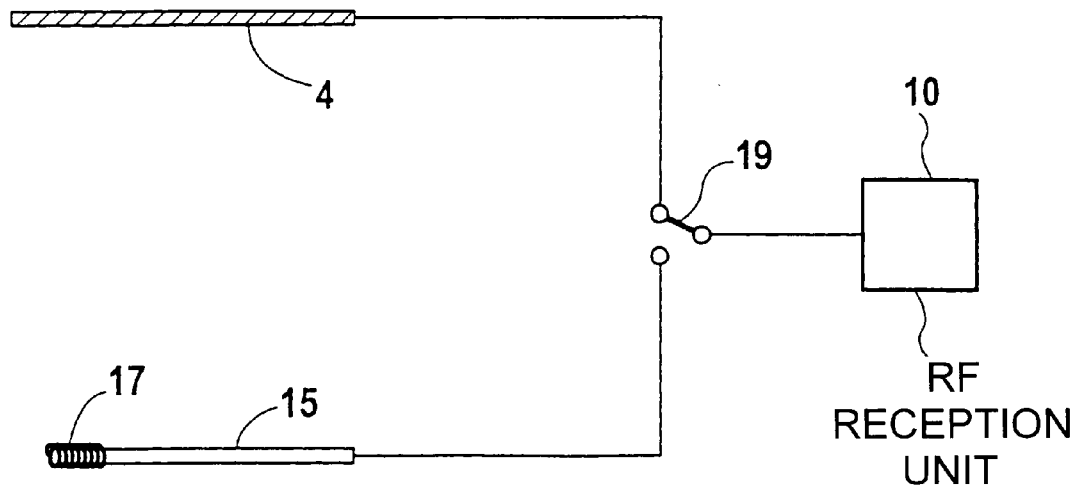
FIG. 4 show a radio-frequency reception channel in the system of FIG. 1 with a switching stage in accordance with the invention.

In known systems, the radio-frequency reception unit 10 was connected via a switching stage 19 either to the radio-frequency antennas 4 or to the radio-frequency reception coil 17, as shown in FIG. 4. The aforementioned method also can be realized by first connecting the radio-frequency reception unit 10 to the radio-frequency antennas 4 and the dataset for a reference image is acquired. Subsequently, the radio-frequency reception unit 10 is connected to the radio-frequency reception coil 17, and the position data for the radio-frequency reception coil 17 are acquired in a known way by applying gradients in three different directions. Although the position determination of the radio-frequency reception coil 17 proceeds very rapidly compared to the determination of the image dataset, since only one measurement for each spatial direction is required, a certain time offset nonetheless remains between the production of the reference image and the position determination, so that the position of the radio-frequency reception coil possibly may be incorrectly shown in the reference image due to movements of the subject under examination.

Figure 5:
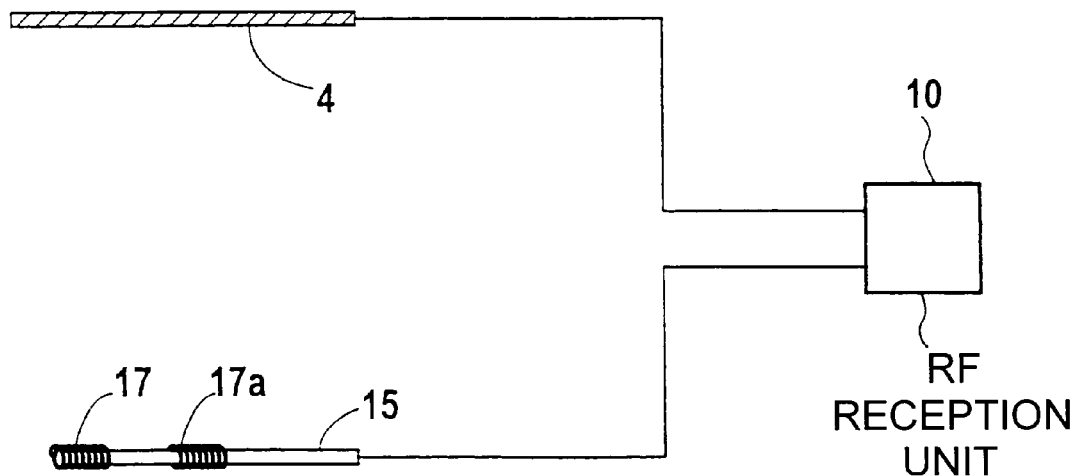
FIG. 5 shows a reception channel with a radio-frequency reception unit that is simultaneously connected to the radio-frequency antenna and the radio-frequency reception coil in the system of FIG. 1 in accordance with the invention.
Figure 6:
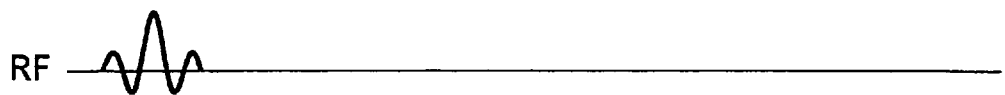
FIGS. 6–10 illustrate an example of a pulse sequence for the implementation of the method of the invention.
Figure 7:
Figure 8:
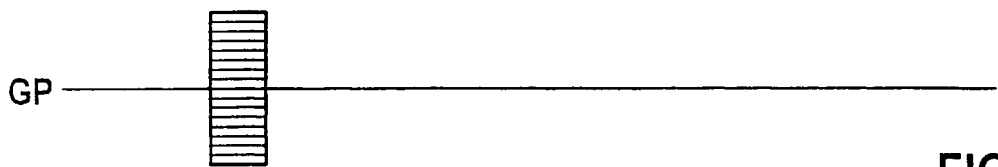
Figure 9:
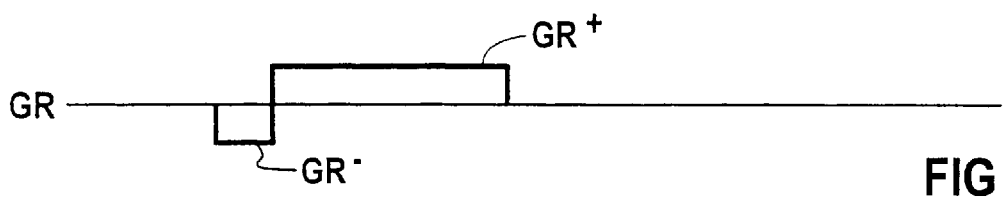
Figure 10:
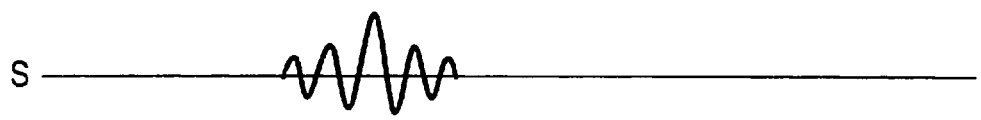

It is also possible, however, to simultaneously implement the data acquisition for the acquisition of a reference image and the position determination by fashioning the radio-frequency reception unit 10 as a two-channel unit, i.e. the radio-frequency antenna 4 and the radio-frequency reception coil 17 are permanently connected to the radio-frequency reception unit 10, which isochronically processes the two signals. Such an arrangement is shown in FIG. 5. As a rule, the antenna 4 for the imaging receives the signal of the entire image space, however, the reception characteristic of the radio-frequency reception coil 17 is designed such that it only receives a signal from its immediate surroundings. A standard imaging sequence as shown, for example, in the form of a gradient echo sequence in FIGS. 6 through 10 is then allowed to sequence. A radio-frequency pulse RF is emitted in a first interval under a positive sub-pulse GS$^+$ of a slice selection gradient. This is followed by a negative sub-pulse GS$^-$ in the slice selection direction that cancels the dephasing caused by the positive sub-pulse GS$^+$. Further, a the phase coding gradient GP is activated in phase coding direction and a pre-phasing pulse GR$^-$ is activated in the negative readout direction. In a third interval, a nuclear magnetic resonance signal S is acquired under a positive readout gradient GR$^+$. This measurement is repeated n times with different values of the phase coding gradient GP. For three-dimensional localization, finally, the entire measurement must be implemented for M slices. This can ensue either by exciting different slices in the excitation, or by activating a phase coding gradient in the slice selection direction.

As mentioned above, the complete three-dimensional dataset is acquired only once; subsequently, only those slices that are respectively predetermined by the position acquisition are updated for saving measuring time and for the improvement of the time resolution that is thereby gained.

As already stated, the signals from the radio-frequency reception coil 17 are also simultaneously evaluated during the image measurement and are likewise entered into a raw data matrix RD ordered according to their phase factors. The position of the radio-frequency reception coil 17 is then determined as follows. A first Fourier transformation is implemented over each row of the raw data matrix. A maximum value of the amplitude is sought in every transformed row of every slice. The position of the maximum value of the amplitude corresponds to the position of the radio-frequency reception coil 17 in a first direction. A first Fourier transformation is implemented over every column of the raw data matrix (note that the raw data are again thereby employed, differing from two-dimensional Fourier transformation). A maximum value is sought in every Fourier-transformed column of every slice. The position of the maximum value of the amplitude corresponds to the position of the radio-frequency reception coil 17 in a second direction perpendicular to the first.

The current position within the slices can ultimately be determined by an interpolation of the position of the different slices in row and column direction.

In the exemplary embodiment according to FIG. 5, another radio-frequency reception coil 17a is arranged at the probe 16. Due to the different positions of these radio-frequency reception coils 17, 17a in the gradient field, two maxima thus are obtained in the received frequency spectrum. The positions of the reception coils 17 and 17a, and thus the orientation of the probe 16 as well, can be acquired with the above-recited method.

Figure 11:
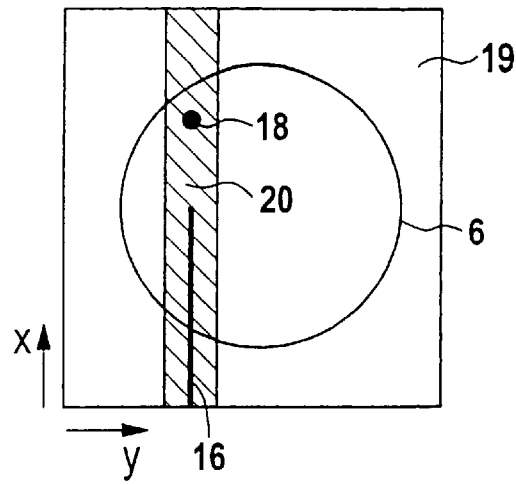
FIG. 11 illustrates a data acquisition strategy employing wavelet coding.
Figure 12:
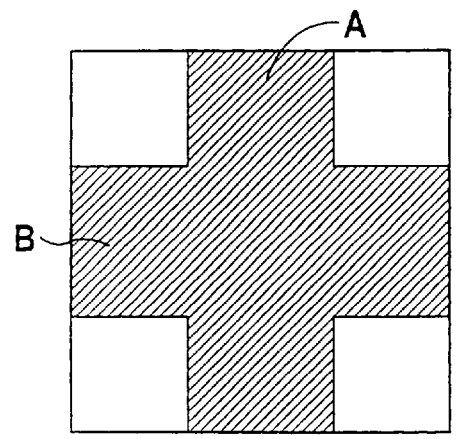
FIG. 12 illustrates a further data acquisition strategy.

The image data acquisition can be accelerated by various measures. Thus, for example, the image data acquisition can ensue according to the wavelet coding method disclosed in the aforementioned German OS 195 28 436, corresponding to U.S. Pat. No. 5,687,725. As explained in greater detail therein, regions of an examination subject can be designationally acquired given wavelet coding, differing from the conventional frequency and phase coding with subsequent Fourier transformation. As shown in FIG. 11, thus, measurements can be designationally implemented for the shaded region 20 in which the motion path of the probe 16 as well as the destination 18 lies. A further possibility for accelerating the image data acquisition is to continuously update only two central regions A and B of the k-space that reside perpendicularly on one another, as shown in FIG. 12. This technique, which is also referred to by the acronym "PHREAK", is disclosed in detail in German OS 43 17 028.

Figure 13:
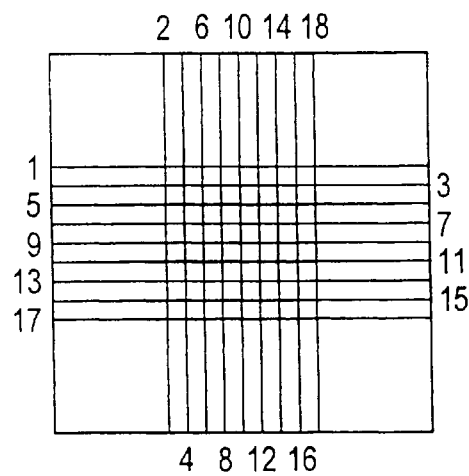
FIG. 13 illustrates a modification of the data acquisition strategy according to FIG. 12.

The position determination can also be accelerated with a modification of this "PHREAK" technique explained below. As indicated by the consecutive numbers in FIG. 13, one row and one column of a raw data matrix are acquired in alternation therefor, i.e. the phase coding direction and the readout coding direction are interchanged in every successive excitation. A position determination of the radio-frequency reception coil within the slice under consideration, however, can already be implemented after measuring one row and one column. The overall time T for the position determination thus amounts to $$T = \text{number of slices} \cdot 2 \cdot T_R$$

whereby $T_R$ is the repetition time of the measuring sequence. Dependent on the number of rows or columns measured in a segment A or B, an acceleration of the position determination by the factor 32 through 64 is achieved compared to the known "PHREAK" technique. An acceleration by as much as a factor of 128 can be achieved compared to standard imaging sequences. More than ten position determinations per second can thus be achieved with currently available MR systems. Individual images are acquired in the sub-second range given simultaneous image data registration.

Adequately high image repetition rates and an adequate time resolution of the position determination is therefore obtained for interventional applications with the described technique. An offset between image data and position data that is important because of possible mispositionings is kept within tolerable limits.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining a location of a positionable object in an examination subject by magnetic resonance comprising the steps of:

(a) disposing an examination subject in magnetic field gradients while acquiring magnetic resonance signals comprising a reference image of at least one slice of the examination subject using a whole body antenna, and frequency coding said magnetic resonance signals in a first direction with alternating signs and phase coding said magnetic resonance signals in a second direction with alternating signs;

(b) attaching at least one radio-frequency reception coil having a small sensitivity region to an object whose position is to be determined and acquiring magnetic resonance signals, in the presence of said magnetic field gradients while said reference image is acquired, from said radio-frequency reception coil, said magnetic resonance signals having a frequency/phase spectrum associated therewith, and identifying a current position of said object from said frequency/phase spectrum of said magnetic resonance signals;

(c) defining a new slice position dependent on said current position of said object and updating said reference image, to obtain an updated reference image only by employing said new slice position in said updated reference image; and (d) multiply repeating steps (a), (b), and (c).

2. A method as claimed in claim 1 wherein step (b) comprises attaching two radio-frequency reception coils to said object, each of said two radio-frequency reception coils having a small sensitivity region, and obtaining respective sets of magnetic resonance signals from said two radio-frequency reception coils, each of said sets of magnetic resonance signals having a respective frequency/phase spectrum associated therewith, and determining said current position and an orientation of said object from the frequency/phase spectra of said sets of magnetic resonance signals.

3. A method as claimed in claim 1 comprising obtaining said magnetic resonance signals from said whole-body reception antenna isochronically with said magnetic resonance signals from said radio-frequency reception coil.

4. A method as claimed in claim 1 wherein step (b) comprises the further steps of:

sampling and digitizing said magnetic resonance signals acquired from said radio-frequency reception coil to obtain sampled, digitized signals having respective frequency and phase coding associated therewith, and entering said sampled, digitized signals into a raw data matrix in k-space dependent on their frequency and phase coding, for determining the location of said object;

conducting respective Fourier transformations of said raw data matrix in two directions to obtain Fourier-transformed signals having respective maximum values; and identifying the position of said object as corresponding to the position of the maximum values of said Fourier-transformed signals.

5. A method as claimed in claim 4 wherein step (a) comprises acquiring reference image magnetic resonance signals, and wherein step (a) comprises the further steps of:

sampling and digitizing said reference image magnetic resonance signals simultaneously with sampling and digitizing said magnetic resonance signals from said radio-frequency reception coil, to obtain sampled, digitized reference image signals, said sampled, digitized reference image signals having respective frequency and phase coding, and entering said sampled, digitized reference image signals into said raw data matrix in k-space dependent on the frequency and phase coding of said sampled, digitized reference image signals, together with said sampled, digitized signals from said radio-frequency reception coil; and wherein the step of conducting respective Fourier transformations of said raw data matrix in two directions comprises conducting respective Fourier transformations of said raw data matrix containing said sampled, digitized reference image signals and said sampled, digitized signals from said reception coil, in two directions.

6. A method as claimed in claim 5 comprising the step of, after obtaining a complete raw dataset of said reference image in k-space in said raw data matrix, subsequently only updating, in step (c) a central region of k-space in said raw data matrix.

7. A method as claimed in claim 5 comprising the step of, after obtaining a complete raw dataset of said reference image in k-space in said raw data matrix, subsequently only updating, in step (c) a central region and selected other, changing regions of k-space in said raw data matrix.

8. A method as claimed in claim 5 comprising the step of, after obtaining a complete raw dataset of said reference image in k-space in said raw data matrix, subsequently only updating, in step (c) two central regions, oriented perpendicularly to each other, of k-space in said raw data matrix.

9. A method as claimed in claim 8 wherein step (c) comprises acquiring magnetic resonance signals with said radio-frequency reception coil only for two regions of said raw dataset oriented perpendicularly to each other corresponding to said two central regions of k-space.

10. A method as claimed in claim 1 wherein said positionable object has a motion path in said subject, and wherein step (b) comprises frequency coding said magnetic resonance signals from said radio-frequency reception coil in a direction of said motion path and wavelet coding said magnetic resonance signals from said radio-frequency reception coil in a direction perpendicular to said direction of said motion path, and wherein step (c) comprises updating a raw dataset of said new slice only for wavelet coding in proximity to said motion path of said object.

11. An apparatus for determining a location of a positionable object in an examination subject by magnetic resonance comprising:

a whole body antenna;

means for generating magnetic gradient fields;

means for acquiring nuclear magnetic resonance signals from the whole body antenna comprising a reference image of at least one slice of an examination subject disposed in said magnetic gradient fields, and for phase coding said magnetic resonance signals in a first direction with alternating signs and for phase coding said magnetic resonance signals in a second direction with alternating signs;

at least one radio-frequency reception coil having a small sensitivity region, attached to an object whose position is to be determined;

means for acquiring magnetic resonance signals, in the presence of said magnetic field gradients, from said radio-frequency reception coil while said reference image is acquired, said magnetic resonance signals having a frequency/phase spectrum associated therewith, and for identifying a current position of said object from said frequency/phase spectrum of said magnetic resonance signals;

means for defining successive, respective new slice positions dependent on successive current positions of said object and for successively updating said reference image, to obtain an update reference images only by incorporating each new slice position in said respective updated images.

12. An apparatus as claimed in claim 11 comprising two of said radio-frequency reception coils to said object, each of said two radio-frequency reception coils having a small sensitivity region, and means for obtaining respective sets of magnetic resonance signals from said two radio-frequency reception coils, each of said sets of magnetic resonance signals having a respective frequency/phase spectrum associated therewith, and means for determining said current position and an orientation of said object from the frequency/phase spectra of said sets of magnetic resonance signals.

13. An apparatus as claimed in claim 11 wherein said means for acquiring a reference image comprise means for obtaining said whole-body magnetic resonance signals from said whole-body reception antenna isochronically with said magnetic resonance signals from said radio-frequency reception coil.

14. An apparatus as claimed in claim 11 comprising:

means for sampling and digitizing said magnetic resonance signals acquired from said radio-frequency reception coil to obtain sampled, digitized signals having respective frequency and phase coding associated therewith, and for entering said sampled, digitized signals into a raw data matrix in k-space dependent on their frequency and phase coding, for determining the location of said object;

means for conducting respective Fourier transformations of said raw data matrix in two directions to obtain Fourier-transformed signals having respective maximum values; and means for identifying the position of said object as corresponding to the position of the maximum values of said Fourier-transformed signals.

15. An apparatus as claimed in claim 14 wherein said apparatus further comprises:

means for sampling and digitizing said reference image magnetic resonance signals simultaneously with sampling and digitizing said magnetic resonance signals from said radio-frequency reception coil, to obtain sampled, digitized reference image signals, said sampled, digitized reference image signals having respective frequency and phase coding, and entering said sampled, digitized reference image signals into said raw data matrix in k-space dependent on the frequency and phase coding of said sampled, digitized reference image signals, together with said sampled, digitized signals from said radio-frequency reception coil; and wherein said means for conducting respective Fourier transformations of said raw data matrix in two directions comprises means for conducting respective Fourier transformations of said raw data matrix containing said sampled, digitized reference image signals and said sampled, digitized signals from said reception coil, in two directions.

16. An apparatus method as claimed in claim 14 wherein said means for updating comprises means for, after obtaining a complete raw dataset of said reference image in k-space in said raw data matrix, subsequently only updating, a central region of k-space in said raw data matrix.

17. An apparatus as claimed in claim 14 wherein said means for updating comprises means for, after obtaining a complete raw dataset of said reference image in k-space in said raw data matrix, subsequently only updating, a central region and selected other, changing regions of k-space in said raw data matrix.

18. An apparatus as claimed in claim 14 wherein said means for updating comprises means for, after obtaining a complete raw dataset of said reference image in k-space in said raw data matrix, subsequently updating only two central regions oriented perpendicularly to each other of k-space in said raw data matrix.

19. An apparatus as claimed in claim 18 wherein said means for acquiring magnetic resonance signals with said radio-frequency reception coil comprises means for acquiring magnetic resonance signals with said radio-frequency reception coil only for two regions of said raw dataset oriented perpendicularly to each other corresponding to said two central regions of k-space.

20. An apparatus as claimed in claim 11 wherein said positionable object has a motion path in said subject, and comprising means for frequency coding said magnetic resonance signals from said radio-frequency reception coil in a direction of said motion path and means for wavelet coding said magnetic resonance signals from said radio-frequency reception coil in a direction perpendicular to said direction of said motion path, and wherein said means for updating comprises means for updating a raw dataset of said new slice only for wavelet coding in proximity to said motion path of said object.

* * * * *